(12) United States Patent
Sun

(10) Patent No.: US 12,137,616 B2
(45) Date of Patent: Nov. 5, 2024

(54) MAGNETORESISTIVE STACK/STRUCTURE AND METHODS THEREFOR

(71) Applicant: Everspin Technologies, Inc., Chandler, AZ (US)

(72) Inventor: Jijun Sun, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 104 days.

(21) Appl. No.: 16/190,299

(22) Filed: Nov. 14, 2018

(65) Prior Publication Data

US 2019/0157549 A1 May 23, 2019

Related U.S. Application Data

(60) Provisional application No. 62/648,743, filed on Mar. 27, 2018, provisional application No. 62/588,158, filed on Nov. 17, 2017.

(51) Int. Cl.

| | | |
|---|---|---|
| *H01L 43/02* | (2006.01) | |
| *G11C 11/16* | (2006.01) | |
| *H01F 41/30* | (2006.01) | |
| *H10B 61/00* | (2023.01) | |
| *H10N 50/01* | (2023.01) | |
| *H10N 50/10* | (2023.01) | |
| *H10N 50/80* | (2023.01) | |
| *H10N 50/85* | (2023.01) | |

(52) U.S. Cl.
CPC ............ *H10N 50/01* (2023.02); *G11C 11/16* (2013.01); *H01F 41/303* (2013.01); *H10B 61/22* (2023.02); *H10N 50/10* (2023.02); *H10N 50/80* (2023.02); *H10N 50/85* (2023.02)

(58) Field of Classification Search
CPC ....... H01L 43/08; H01L 43/12; H01L 27/228; H01L 43/10; H01L 43/02; G11C 11/16; H01F 41/303
See application file for complete search history.

(56) References Cited

U.S. PATENT DOCUMENTS

| | | | |
|---|---|---|---|
| 3,148,079 A * | 9/1964 | Banks .................. | C23C 14/5806 148/306 |
| 6,051,113 A * | 4/2000 | Moslehi ................ | C23C 14/568 204/192.15 |
| 6,287,437 B1 * | 9/2001 | Pandhumsoporn ........................ | C23C 14/3407 427/398.1 |
| 8,686,484 B2 | 4/2014 | Whig et al. | |

(Continued)

OTHER PUBLICATIONS

International Search Report and Written Opinion issued in International Application No. PCT/US2018/060898, issued Feb. 19, 2019 (13 pages).

*Primary Examiner* — Hrayr A Sayadian
(74) *Attorney, Agent, or Firm* — Bookoff McAndrews PLLC

(57) ABSTRACT

A method of fabricating a magnetoresistive device includes forming a magnetically fixed region on one side of an intermediate region. Forming the magnetically fixed region may include forming a first ferromagnetic region and forming an antiferromagnetic coupling region on one side of the first ferromagnetic region. The method may also include treating a surface of the coupling region by exposing the surface to a gas, and forming a second ferromagnetic region on the treated surface of the coupling region.

20 Claims, 8 Drawing Sheets

(56) References Cited

U.S. PATENT DOCUMENTS

| | | | |
|---|---|---|---|
| 9,136,464 B1 | 9/2015 | Whig et al. | |
| 9,196,272 B1* | 11/2015 | Nikolaev | G11B 5/3906 |
| 9,419,208 B2 | 8/2016 | Whig et al. | |
| 10,309,722 B1* | 6/2019 | Troxler | F26B 5/048 |
| 2005/0201022 A1* | 9/2005 | Horng | H01L 43/12 |
| 2006/0017081 A1* | 1/2006 | Sun | H01L 43/12 |
| | | | 257/295 |
| 2009/0121266 A1* | 5/2009 | Pietambaram | G11C 11/161 |
| | | | 257/295 |
| 2009/0219754 A1 | 9/2009 | Fukumoto | |
| 2009/0256220 A1* | 10/2009 | Horng | H10N 50/01 |
| | | | 257/E29.323 |
| 2014/0145792 A1* | 5/2014 | Wang | H01F 10/329 |
| | | | 331/94.1 |
| 2016/0163965 A1* | 6/2016 | Han | H10N 50/01 |
| | | | 257/467 |
| 2016/0181508 A1 | 6/2016 | Lee et al. | |

* cited by examiner

MAGNETORESISTIVE STACK/STRUCTURE AND METHODS THEREFOR

CROSS-REFERENCE TO RELATED APPLICATIONS

This application claims the benefit of priority from U.S. Provisional Application No. 62/588,158, filed on Nov. 17, 2017, and U.S. Provisional Application No. 62/648,743, filed on Mar. 27, 2018, each of which is incorporated by reference herein in its entirety.

TECHNICAL FIELD

The present disclosure relates to, among other things, embodiments and aspects of magnetoresistive stacks/structures and methods therefor, including methods of use and methods of manufacturing the disclosed magnetoresistive stacks/structures.

INTRODUCTION

There are many inventions described and illustrated herein, as well as many aspects and embodiments of those inventions. In one aspect, the present disclosure relates to a magnetoresistive stack/structure (for example, a magnetoresistive memory stack/structure or a magnetoresistive sensor/transducer stack/structure) and methods of manufacturing such a stack/structure. In one embodiment, the disclosed magnetoresistive stack/structure is implemented in an MTJ-type magnetoresistive stack/structure having a perpendicular magnetic anisotropy, wherein the fixed magnetic region maintains or includes improved properties (for example, magnetoresistance (MR), resistance-area product (RA), and delta RA of the stack/structure) after subsequent or additional processing. Notably, the embodiments described herein may employ any technique now known or later developed to manufacture the MTJ stack/structure; all such techniques are intended to fall within the scope of the present disclosure. In one embodiment, the described MTJ stack/structure may be implemented as a magnetoresistive memory stack/structure.

Briefly, a magnetoresistive memory stack/structure, in one embodiment, includes at least one non-magnetic layer (for example, at least one dielectric layer or at least one conductive layer) disposed between a "fixed" magnetic region and a "free" magnetic region, each including a plurality of layers of one or more magnetic or ferromagnetic materials. Information is stored in the magnetoresistive memory stack/structure by switching, programming, and/or controlling the direction of magnetization vectors in one or more of the magnetic layers of the "free" magnetic region of the stack/structure. Here, the direction of the magnetization vectors of the "free" magnetic region may be switched and/or programmed (for example, through spin transfer torque) by application of a write signal (e.g., one or more current pulses) to or through the magnetoresistive memory stack/structure while, in contrast, the magnetization vectors in the magnetic layers of a "fixed" magnetic region are magnetically fixed (in a predetermined direction).

The magnetoresistive memory stack/structure includes an electrical resistance that depends on the magnetic state of certain regions of the memory stack/structure. That is, when the magnetization vectors of the "free" magnetic region are in a first state or in a first direction (for example, which is the same direction as the direction of the magnetization vectors of the "fixed" magnetic region), the magnetoresistive memory stack/structure has a first magnetic state, which may correspond to a low electrical resistance state. Conversely, when the magnetization vectors of the "free" magnetic region are in a second state or in a second direction (for example, which is a different direction (for example, opposite or opposing) as the direction of the magnetization vectors of the "fixed" magnetic region), the magnetoresistive memory stack/structure has a second magnetic state, which may correspond to a high electrical resistance state. The magnetic state of the magnetoresistive memory stack/structure is determined or read based on the resistance of the stack/structure in response to a read current of a read operation.

It should be noted that, although exemplary embodiments are described and/or illustrated herein in the context of MTJ stacks/structures, the present inventions may also be implemented in giant magnetoresistive (GMR) stacks/structures where a conductor (e.g., copper) is disposed between two ferromagnetic regions/layers/materials. Indeed, the present inventions may be employed in connection with other types of magnetoresistive stacks/structures wherein such stacks/structures include a fixed magnetic region. For the sake of brevity the discussions and illustrations will not be repeated specifically in the context of GMR or other magnetoresistive stacks/structures—but such discussions and illustrations are to be interpreted as being entirely applicable to GMR and other stacks/structures.

BRIEF DESCRIPTION OF THE DRAWINGS

Embodiments of the present disclosure may be implemented in connection with aspects illustrated in the attached drawings. These drawings show different aspects of the present inventions and, where appropriate, reference numerals illustrating like structures, components, materials and/or elements in different figures are labeled similarly. It is understood that various combinations of the structures, components, and/or elements, other than those specifically shown, are contemplated and are within the scope of the present inventions.

For simplicity and clarity of illustration, the figures depict the general structure and/or manner of construction of the various embodiments. For ease of illustration, the figures depict the different layers/regions of the illustrated stacks as having a uniform thickness and well defined boundaries with straight edges. However, a person skilled in the art would recognize that, in reality, the different layers typically have a non-uniform thickness. And, at the interface between adjacent layers, the materials of these layers alloy together, or migrate into one or the other material, making their boundaries ill defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and describe various processing steps. One skilled in the art would appreciate that the cross-sectional views are not drawn to scale and should not be viewed as representing proportional relationships between different regions/layers. Moreover, while certain regions/layers and features are illustrated with straight 90-degree edges, in actuality or practice such regions/layers may be more "rounded" and gradually sloping.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s). Further, even though the figures and this written disclosure appear to describe the disclose magnetoresistive stack/structures in a particular order of construction (e.g., from bottom to top), it is understood that the depicted magnetoresistive stack/structures may have the opposite order (e.g., from top to bottom). For example, a "fixed" magnetic region may be formed on or above a "free" magnetic region or layer, which in turn may be formed on or above an insertion layer of the present disclosure.

Figure 2:
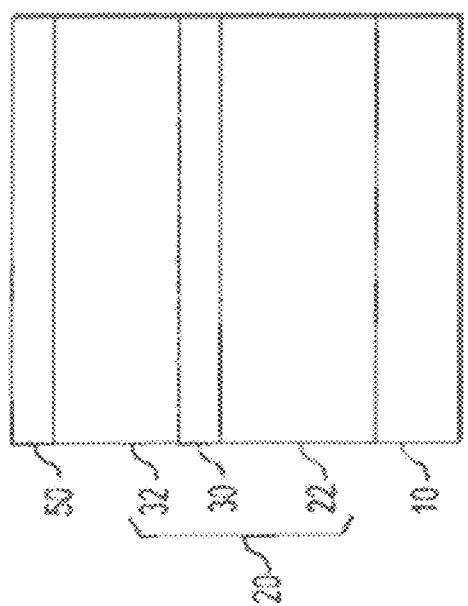
Figure 3:
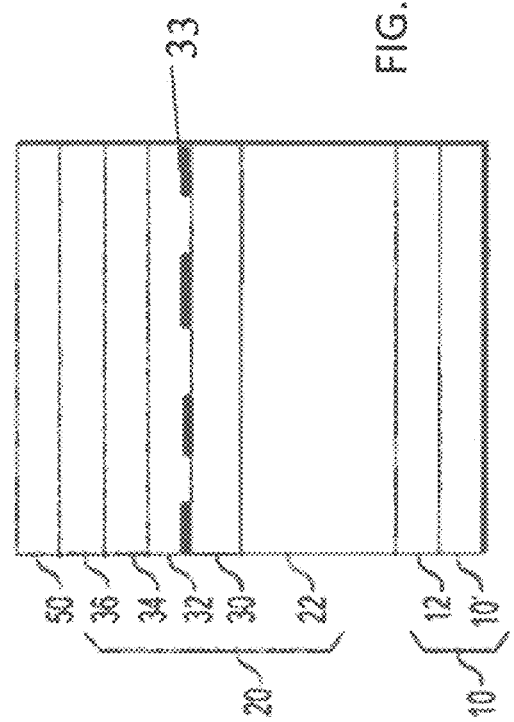
Figure 1:
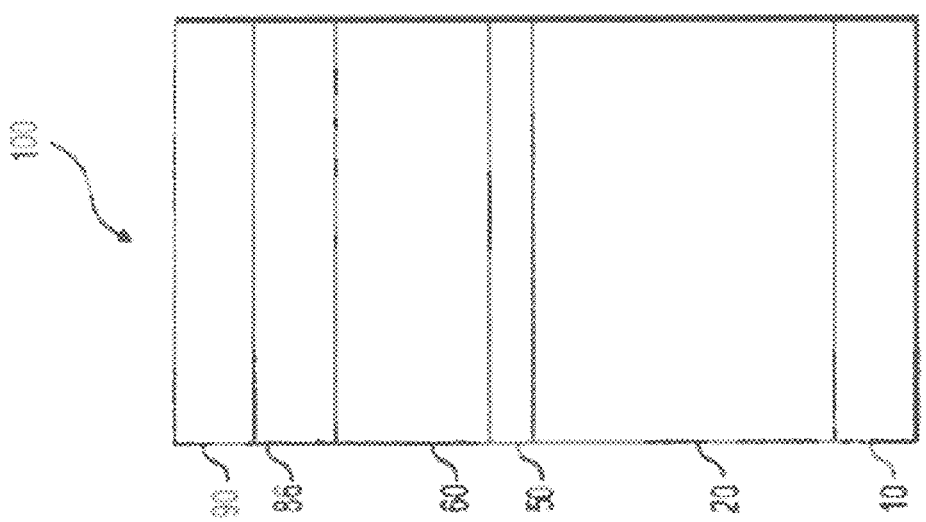
Figure 4A:
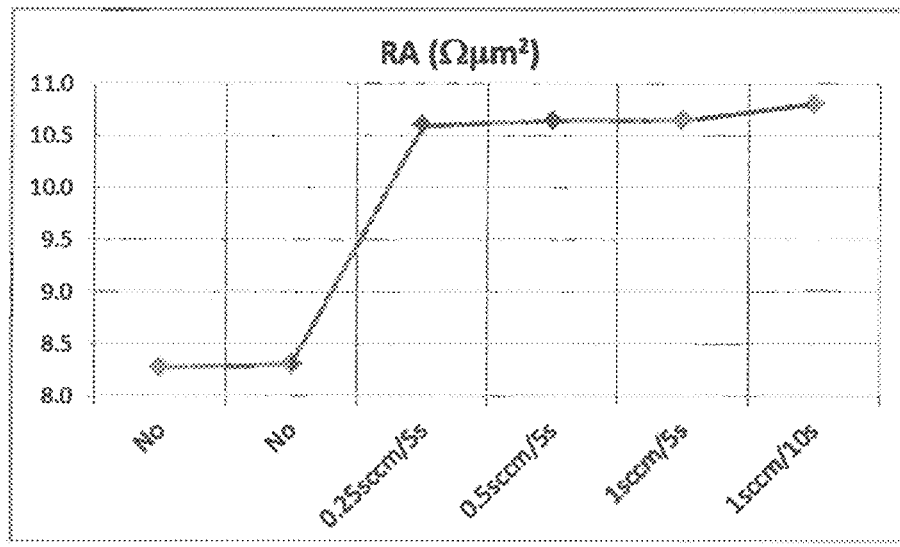
Figure 4B:
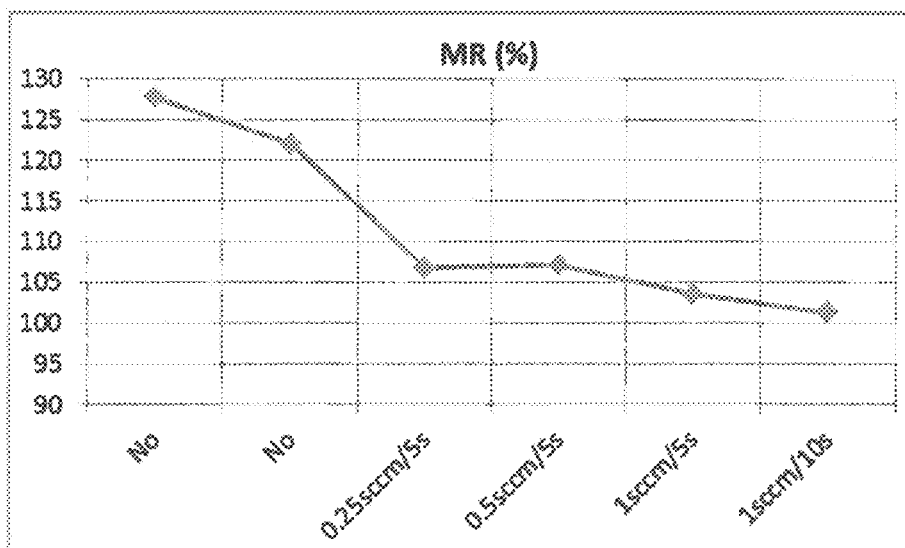
Figure 4C:
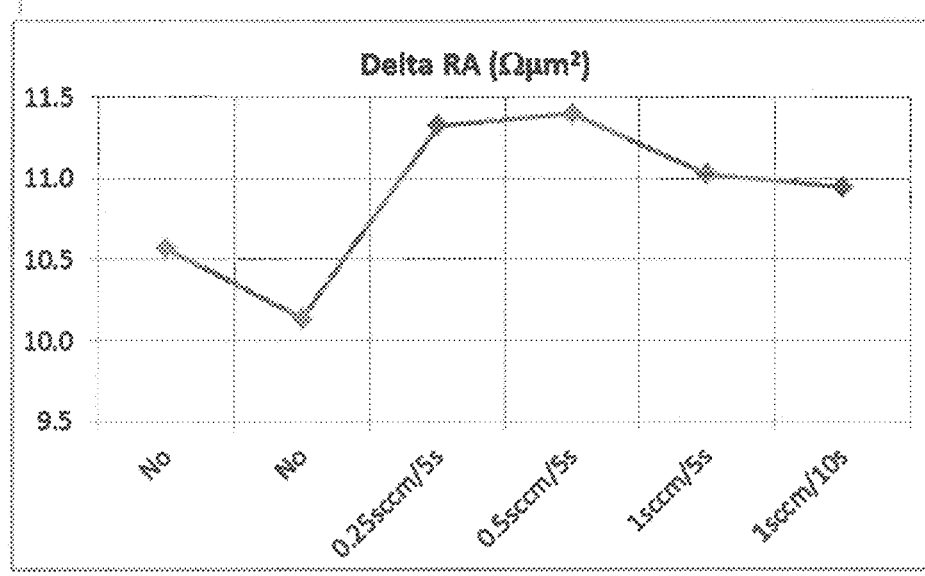
Figure 5A:
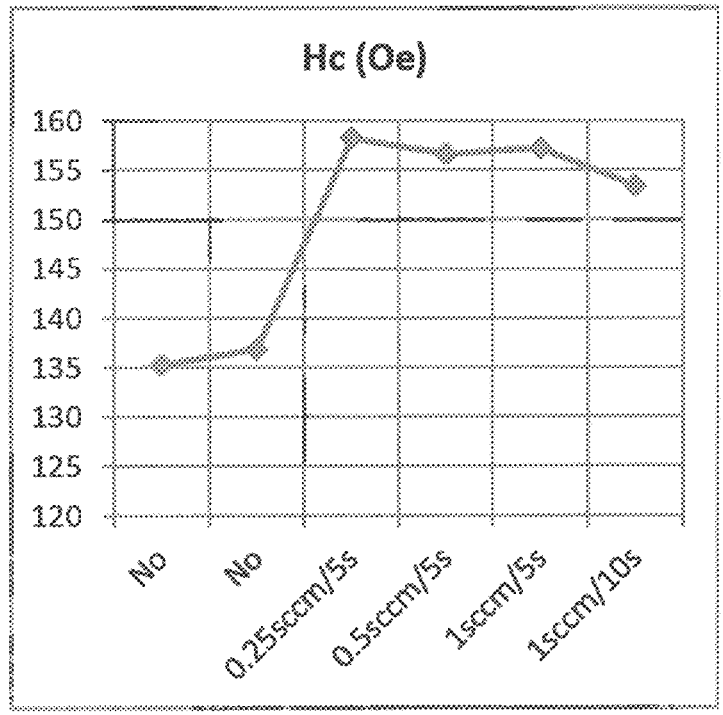
Figure 5B:
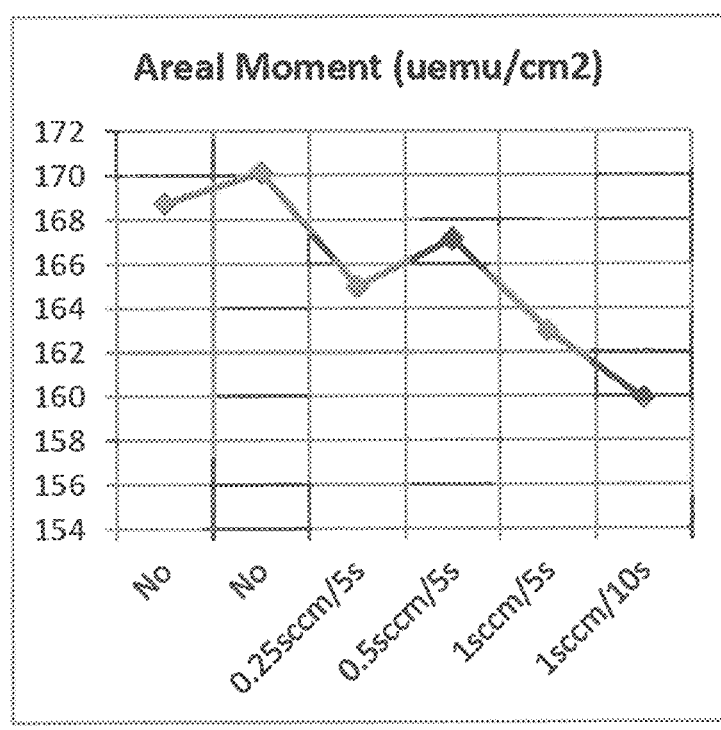
Figure 6A:
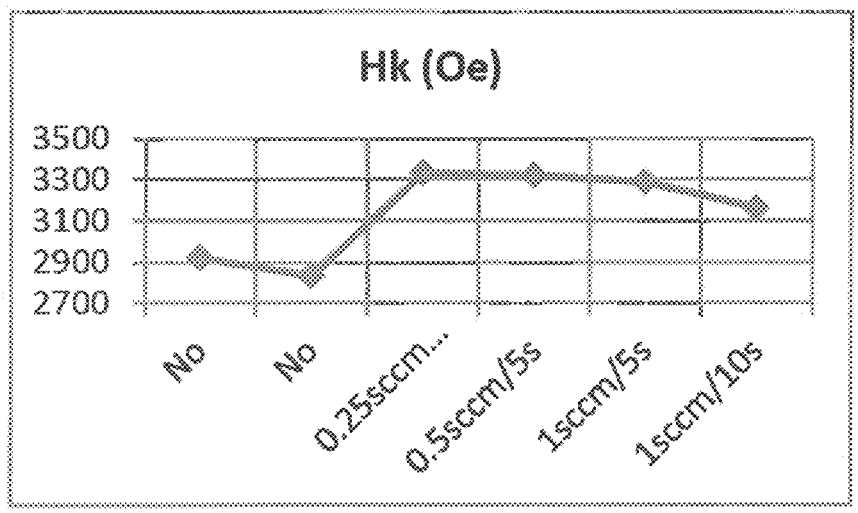
Figure 6B:
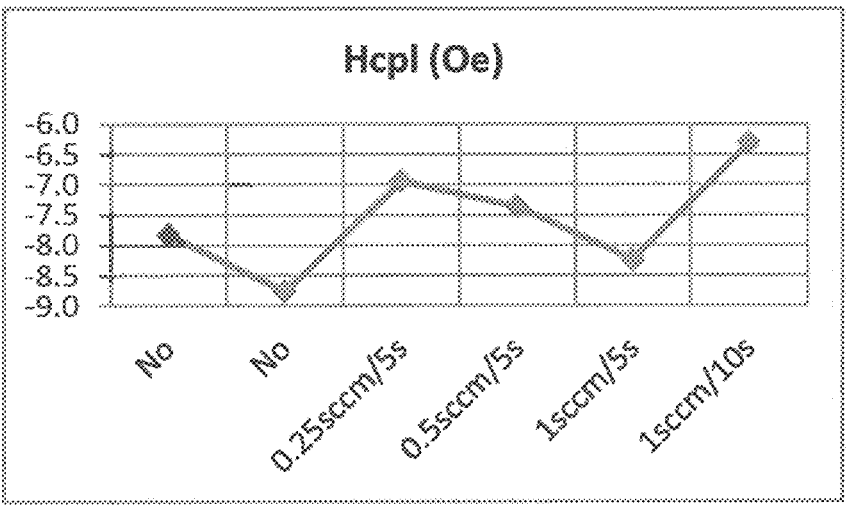
Figure 6C:
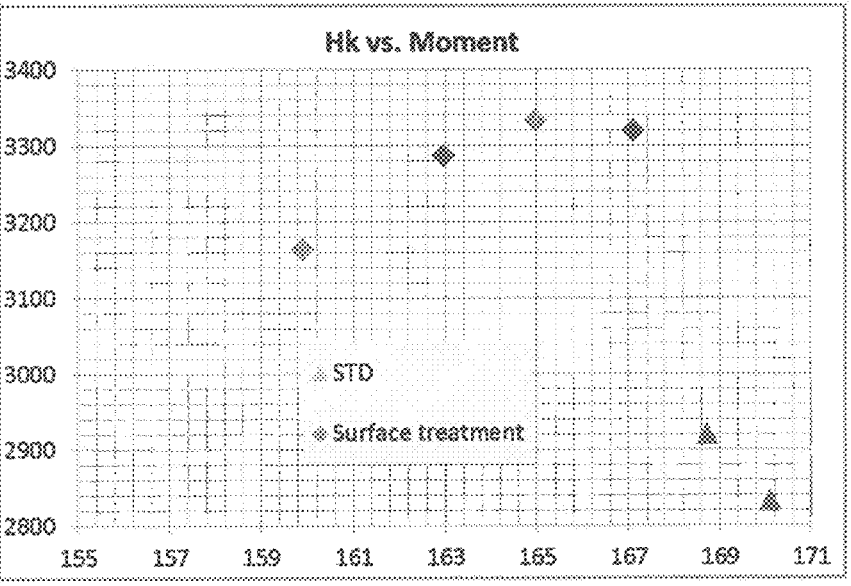
Figure 9A:
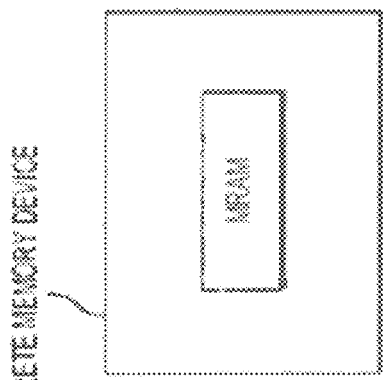
Figure 9B:
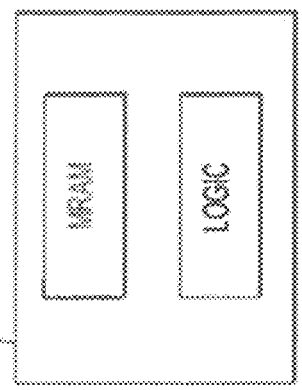
Figure 8:
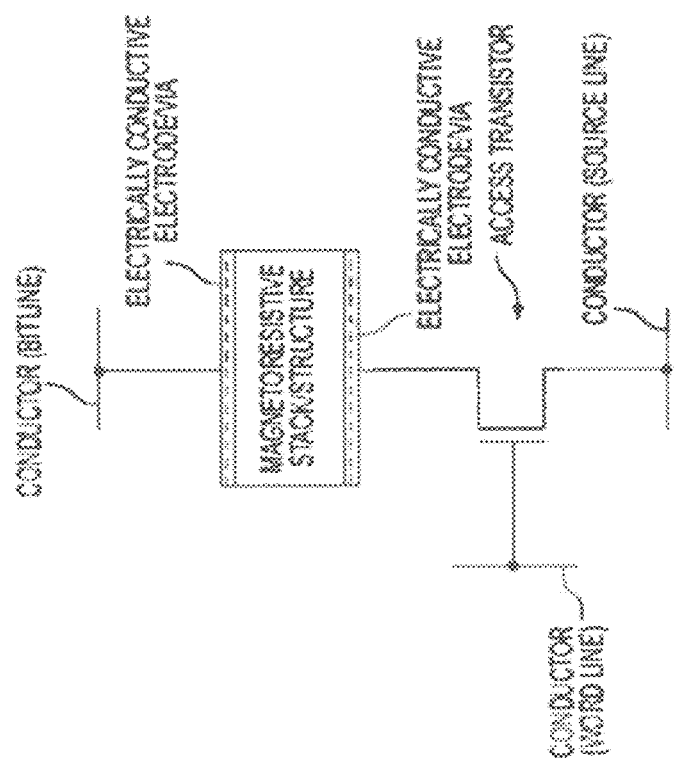
Figure 10:
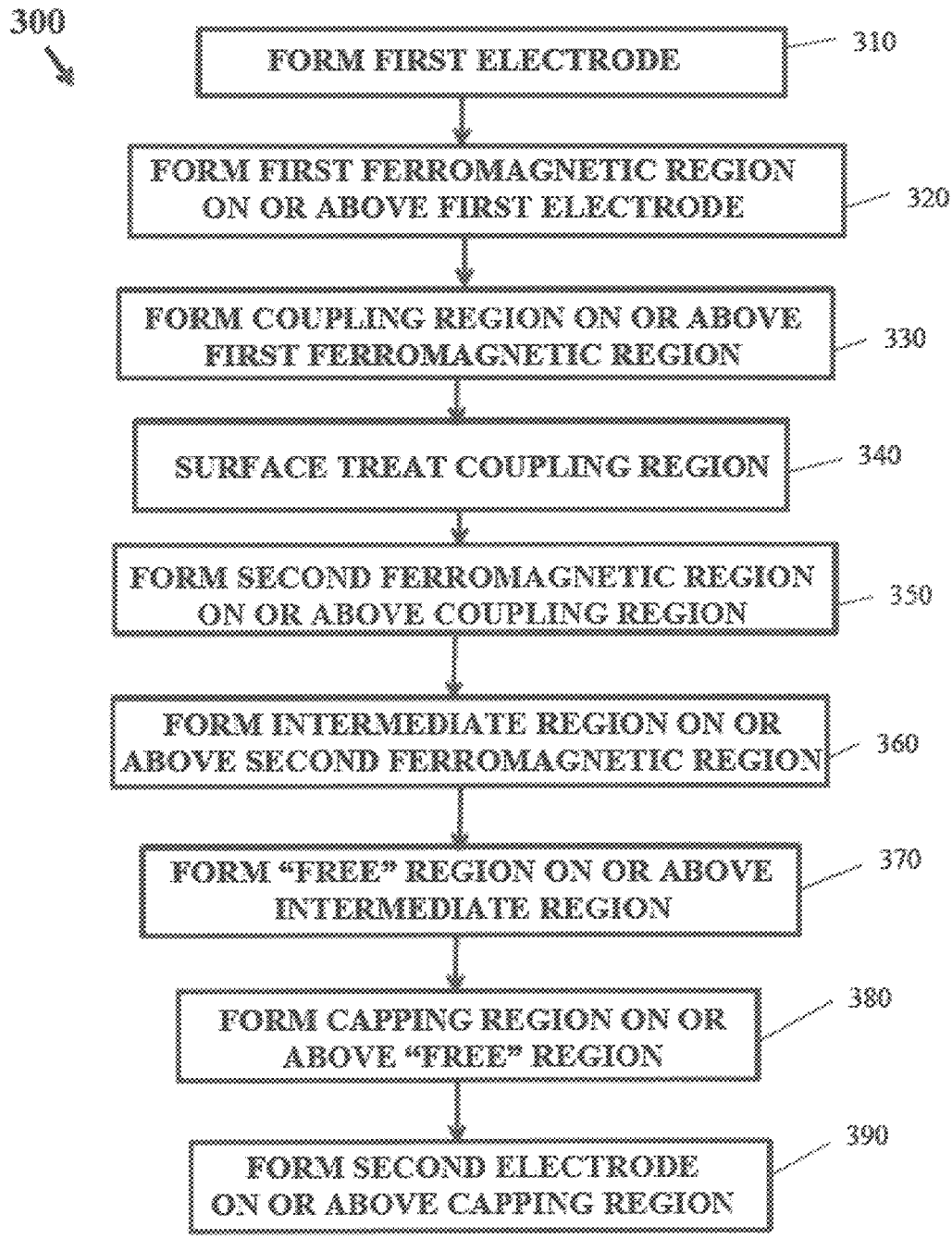
Figure 11:
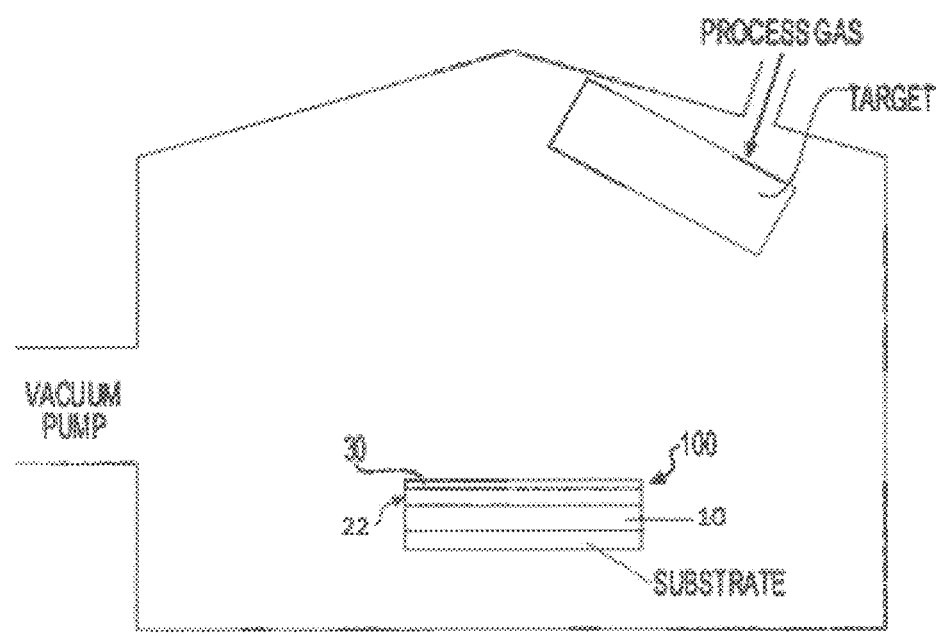

FIG. 1 illustrates a cross-sectional view of layers of an exemplary MTJ-type magnetoresistive stack/structure (for example, an in-plane or out-of-plane magnetic anisotropy magnetoresistive stack/structure (e.g., a perpendicular magnetic anisotropy magnetoresistive stack/structure)) including an intermediate layer, such as, for example, a dielectric layer, disposed between a "free" magnetic layer (or region) and a "fixed" magnetic layer (or region) wherein, in some exemplary embodiments, the "fixed" magnetic layer may be disposed between an electrode and a dielectric layer (which may be a tunnel barrier in the completed structure), according to at least certain aspects of certain embodiments of the present inventions; in this exemplary embodiment, the MTJ-type magnetoresistive stack/structure is disposed between and in physical contact with electrically conductive electrodes/vias/lines made of (for example, in the context of electrodes or vias, tantalum, or an alloy thereof (such as a tantalum-nitride alloy), or a composite thereof (such as a tantalum and tantalum-nitride alloy composite)); notably, the "free" magnetic layer and the "fixed" magnetic layer may each include a plurality of layers of magnetic or ferromagnetic material(s) (for example, nickel, iron, cobalt, palladium, platinum, magnesium, manganese, chromium, and alloys thereof) as well as one or more synthetic antiferromagnetic structures (SAF) or synthetic ferromagnetic structures (SyF), wherein one or more layers of magnetic materials layers may also include one or more non-magnetic materials layers (for example, ruthenium, copper, aluminum, tantalum, titanium, niobium, vanadium, zirconium, and one or more alloys thereof, and in certain embodiments, tungsten and molybdenum); moreover, the dielectric layers may be, for example, one or more layers of, for example, aluminum oxide ($Al_2O_3$) and/or magnesium oxide (MgO);

FIG. 2 illustrates a cross-sectional view of exemplary layers that may be included in one exemplary "fixed" magnetic region of the exemplary MTJ-type magnetoresistive stack/structure depicted in FIG. 1;

FIG. 3 illustrates a cross-sectional view of exemplary layers that may be included in another exemplary "fixed" magnetic region of the exemplary MTJ-type magnetoresistive stack/structure depicted in FIG. 1, wherein the electrode may include a seed layer disposed at its interface with the "fixed" magnetic region;

FIGS. 4A-4C show experimental results comparing parameters of magnetoresistive devices with and without an exemplary surface treatment of the current disclosure;

FIGS. 5A-7B show experimental results comparing magnetic parameters of magnetoresistive devices with and without an exemplary surface treatment of the current disclosure;

FIG. 8 is an schematic diagram of an exemplary magnetoresistive memory stack/structure electrically connected to an access transistor in a magnetoresistive memory cell configuration;

FIGS. 9A-9B are schematic block diagrams of integrated circuits including a discrete memory device and an embedded memory device, each including MRAM (which, in one embodiment is representative of one or more arrays of MRAM having a plurality of magnetoresistive memory stacks/structures, according to aspects of certain embodiments of the present disclosure;

FIG. 10 is a simplified exemplary manufacturing flow for the formation (e.g., via deposition) of layers of the exemplary MTJ-type magnetoresistive stack/structures described herein, according to at least certain aspects of certain embodiments of the present disclosure, wherein the various layers and/or regions are sequentially deposited, grown, sputtered, evaporated, and/or provided (used herein collectively as "deposited" or other verb tense (e.g., "deposit" or "depositing")) to provide the material stack/structure that, after further processing, is an MTJ-type magnetoresistive stack/structure (having, for example, a perpendicular magnetic anisotropy); and FIG. 11 is a schematic illustration of an exemplary process chamber used to treat the surface of the coupling region of a magnetoresistive stack/structure in an exemplary embodiment.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1 t) to (t+0.1 t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, mean the value, limit, and/or range ±10%.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

In this disclosure, the term "region" is used generally to refer to one or more layers. That is, a "region" (as used herein) may include a single layer (or coating) of material or multiple layers of materials stacked one on top of another to form a multi-layer system. Further, although in the description below, the different regions in the disclosed stack/structure are referred to by specific names (capping region, reference region, transition region, etc.), this is only for ease of description and not intended as a functional description of the layer.

As alluded to above, in one exemplary aspect, the magnetoresistive stack/structure of the present disclosure may be implemented as a spin-torque magnetoresistive random access memory ("MRAM") element ("memory element"). In such aspects, the stack/structure may include an intermediate region positioned (or sandwiched) between two ferromagnetic regions to form a magnetic tunnel junction (MTJ) device or an MTJ-type device. The intermediate region may be a tunnel barrier and include an insulating material, such as, e.g., a dielectric material. In other embodiments, the intermediate region may be a conductive material, e.g., copper, gold, or alloys thereof. In these other embodiments, where the magnetoresistive stack/structure includes a conductive material in between two ferromagnetic regions, the magnetoresistive stack/structure may form a GMR or GMR-type device.

Of the two ferromagnetic regions disposed on either side of the intermediate region, one ferromagnetic region may be a magnetically "fixed" or pinned region, and the other ferromagnetic region may be a magnetically "free" region. As alluded to above, the term "free" is intended to refer to ferromagnetic regions having a magnetic moment that may shift or move significantly in response to applied magnetic fields or spin-polarized currents used to switch the magnetic moment vector. On the other hand, the words "fixed" and "pinned" are used to refer to ferromagnetic regions having a magnetic moment vector does not move substantially in response to such applied magnetic fields or spin-polarized currents. As is known in the art, an electrical resistance of the described magnetoresistive stack/structure may change based on whether the magnetization direction (e.g., the direction of the magnetic moment) of the "free" region is in a parallel alignment or in an antiparallel alignment with the magnetization direction (e.g., the direction of the magnetic moment) of the "fixed" region. Typically, if the two regions have the same magnetization alignment, the resulting low resistance is considered as a digital "0," while if the alignment is antiparallel the resulting higher resistance is considered to be a digital "1." A memory device (such as an MRAM) may include multiple such magnetoresistive stacks/structures, which may be referred to as memory cells or elements, arranged in an array of columns and rows. By measuring the current through each cell, the resistance of each cell, and thus the data stored in the memory array can be read.

Switching the magnetization direction of the "free" region of a magnetoresistive stack/structure may be accomplished by driving a tunneling current pulse through the magnetoresistive stack/structure. The polarity of the current pulse determines the final magnetization state (i.e., parallel or antiparallel) of the "free" region. The mean current required to switch the magnetic state of the "free" region may be referred to as the critical current (Ic). The critical current is indicative of the current required to "write" data in (or the write current of) a magnetoresistive memory cell. Reducing the required write current(s) is desirable so that, among other things, a smaller access transistor can be used for each memory cell and a higher density, lower cost memory can be produced.

Magnetoresistance ratio (MR) is the ratio of the change in resistance of a magnetoresistive stack/structure between its high and low resistance states (MR=$(R_H-R_L)/R_L$, where $R_L$ and $R_H$ are the magnetoresistive stack/structure resistance in the low and high resistance states, respectively). MR is indicative of the strength of the signal when a memory element is "read." For an MTJ-type magnetoresistive stack/structure with a strong read signal, a larger MR (i.e., a larger difference between the individual resistances $R_H$ and $R_L$) is desirable. When the intermediate region of magnetoresistive stack/structure is a tunnel barrier made of a dielectric material, the resistance may be measured by the resistance-area product (RA). As used herein "delta RA" refers to a change in RA between high and low resistance states (A stands for area). Embodiments of the present disclosure relate to methods and apparatus for increasing RA and/or decreasing MR.

For the sake of brevity, conventional techniques related to semiconductor processing may not be described in detail herein. The exemplary embodiments may be fabricated using known lithographic processes. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or not exposed to the radiation, is removed by the application of a developer. An etch may then be employed/applied whereby the layer not protected by the remaining resist is patterned.

Alternatively, an additive process can be used in which a structure is built up using the photoresist as a template.

As noted above, in one aspect, the described embodiments relate to, among other things, methods of manufacturing a magnetoresistive stack/structure having one or more electrically conductive electrodes, vias, or conductors on either side of a magnetic material stack. As described in further detail below, the magnetic material stack/structure may include many different layers of material, where some of the layers include magnetic materials, whereas others do not. In one embodiment, the methods of manufacturing include sequentially depositing, growing, sputtering, evaporating, and/or providing (as noted above, herein collectively "depositing" or other verb tense (e.g., "deposit" or "deposited")) layers and regions which, after further processing (for example, etching) those layers form a magnetoresistive stack/structure.

The magnetoresistive stacks/structures of the present inventions may be formed between a top electrode/via/line (e.g., electrode 90) and a bottom electrode/via/line (e.g., electrode 10) and, which permit access to the stack/structure by allowing for connectivity (for example, electrical) to circuitry and other elements of the magnetoresistive device. Between the electrodes/vias/lines are regions (i.e., regions made of one or more layers), including at least one "fixed" magnetic region (which includes, among other things, a plurality of ferromagnetic layers), a seed region (which in at least one embodiment is disposed between the electrically conductive electrode/via/line and the at least one "fixed" magnetic region), at least one "free" magnetic region (which includes, among other things, a plurality of ferromagnetic layers), and one or more dielectric regions disposed between a "fixed" magnetic region and the "free" magnetic region, to provide an intermediate region (e.g., a tunnel barrier layer) therebetween. In some embodiments, the top electrode (and/or the bottom electrode) may be eliminated, and the bit line may be formed on top of the stack.

FIG. 1 is a cross-sectional view of regions (or layers) of an exemplary MTJ-type magnetoresistive stack/structure 100 (for example, an in-plane or out-of-plane magnetic anisotropy magnetoresistive stack/structure (e.g., a perpendicular magnetic anisotropy magnetoresistive stack/structure)). It will be recognized that several other commonly-used regions (or layers) (e.g., various protective cap layers, seed layers, underlying substrate, etc.) have not been illustrated in FIG. 1 (and in subsequent figures) for clarity. As illustrated in FIG. 1, magnetoresistive stack/structure 100 includes multiple regions arranged one over the other to form a stack/structure between a first electrode 10 and a second electrode 90. As shown in FIG. 1, first electrode 10 may be a "bottom" electrode, and second electrode 90 may be a "top" electrode. However, those of ordinary skill in the art will recognize that the relative order of the various regions of magnetoresistive stack/structure 100 may be reversed. For example, first electrode 10 may be a top electrode and second electrode 90 may be a bottom electrode. Further, in some embodiments, the top electrode (and/or the bottom electrode) may be eliminated, and the bit line may be formed on top of the stack. The bottom and top electrodes 10, 90 may comprise an electrically conductive material, and may be part of (or be in physical contact with) electrically conductive interconnects (e.g., vias, traces, lines, etc.) of magnetoresistive stack/structure 100. Although any electrically conductive material may be used for bottom and top electrodes 10, 90, in some embodiments, a metal such as tantalum (Ta), titanium (Ti), tungsten (W), or a composite or alloy of these elements (e.g., tantalum-nitride alloy) may be used.

With continuing reference to FIG. 1, "fixed" region 20 may be formed on or above bottom electrode 10. Although not illustrated in FIG. 1, in some embodiments, bottom electrode 10 may be formed on a planar surface of a semiconductor substrate (e.g., a semiconductor substrate having transistors, etc. formed thereon). "Fixed" region 20 may serve as a "fixed" magnetic region of magnetoresistive stack/structure 100. That is, a magnetic moment vector in the "fixed" region 20 does not move significantly in response to applied magnetic fields (e.g., an external field) or applied currents used to switch the magnetic moment vector of "free" region 60, as explained above. While the "fixed" region 20 of FIG. 1 is shown as a single layer, "fixed" region 20 may include several layers of a magnetic or a ferromagnetic material. In addition, "fixed" region 20 may include additional layers, including, but not limited to, an antiferromagnetic coupling layer, a reference layer, and/or a transition layer, as described below in greater detail, e.g., in connection with FIG. 3.

In some embodiments, the layers of "fixed" region 20 may include alloys that include cobalt and iron (preferably cobalt, iron, and boron). In some embodiments, the composition of materials (e.g., cobalt, iron, and boron) in the "fixed" region 20 may be selected to achieve good temperature compensation. In some embodiments, these layers may also include, for example, alloys or engineered materials with one or more of palladium, platinum, magnesium, manganese, and chromium. Additionally or alternatively, in some embodiments, the "fixed" region 20 may include one or more synthetic antiferromagnetic structures (SAF) or synthetic ferromagnetic structures (SyF). Since SAFs and SyFs are known to those skilled in the art, additional description is omitted for sake of brevity.

In some embodiments, "fixed" region 20 also may include one or more non-magnetic material layers. For example, ruthenium, rhodium, platinum, palladium, rhenium, iridium, copper, aluminum, tantalum, titanium, niobium, vanadium, zirconium, iridium, one or more alloys of these elements, and in certain embodiments, tungsten and molybdenum. In some embodiments, "fixed" region 20 may include a multi-layer structure of cobalt and platinum or cobalt and nickel (with or without other alloying elements). For example, in embodiments where "fixed" region 20 is a multi-layer structure of cobalt and platinum, "fixed" region 20 may include a cobalt layer (formed on or above a surface of electrode 10) followed by a platinum layer formed on or above a surface of the cobalt layer. In general, "fixed" region 20 may have any thickness. In some embodiments, the "fixed" region 20 may have a thickness in the range of between approximately 8 Å and approximately 300 Å, between approximately 15 Å and approximately 110 Å, greater than or equal to 8 Å, greater than or equal to 15 Å, less than or equal to 300 Å, or less than or equal to 110 Å. "Fixed" region 20 may be deposited or formed using any technique now known or later developed; all of which are intended to fall within the scope of the present disclosure.

Turning now to FIG. 2, there is illustrated an exemplary embodiment of "fixed" region 20 having a plurality of layers. It should be noted that, for the sake of clarity, only certain layers that comprise the "fixed" region 20, and only certain exemplary regions/layers on either side of the "fixed" region 20 (e.g., electrode 10 and intermediate layer 50) are illustrated in FIG. 2. Those of ordinary skill in the art will readily recognize that one or more additional layers, interface areas, and/or regions may be included within "fixed" region 20 and/or may be disposed between the layers of "fixed" region 20 and the depicted exemplary regions on either side of "fixed" region 20.

In one example, "fixed" region 20 may be a fixed, unpinned synthetic antiferromagnetic (SAF) region disposed on or above electrode 10. The fixed, unpinned synthetic antiferromagnetic (SAF) region may include at least two magnetic regions 22, 32 (e.g., ferromagnetic layer 1 and ferromagnetic layer 2 in FIG. 2) separated by a coupling region or layer 30. One or more of magnetic regions 22, 32 may include one or more of the ferromagnetic elements, such as, e.g., nickel, iron, and/or cobalt, including alloys or engineered materials with one or more of the elements palladium, platinum, chromium, and alloys thereof. The coupling region 30 may be an antiferromagnetic (AF) coupling layer including, e.g., non-ferromagnetic materials such iridium, ruthenium, rhenium, or rhodium.

In some aspects at least one of the magnetic regions 22, 32 may include a magnetic multi-layer structure including a plurality of layers (i) of a first ferromagnetic material (e.g., cobalt) and (ii) a second ferromagnetic material (e.g., nickel) or a paramagnetic material (e.g., platinum). For example, as shown in FIG. 3, magnetic region 32 may include a multi-layer structure, as described in greater detail below. In one embodiment, the interfacial layers of a multi-layer magnetic structure (e.g., layer 32 in FIG. 3) of the fixed, unpinned SAF region (for example, depending on the location of the multi-layer structure within the fixed unpinned SAF region that are in contact or interface with electrode 10, seed region 12, the AF coupling layer 30, transition layer 34, and/or the intermediate layer 50) may include a layer of ferromagnetic material having a thickness which is greater than the thicknesses of one or more (or all) of the internal layers of the multi-layer magnetic region (i.e., layers of (i) of a first ferromagnetic material (e.g., cobalt) and (ii) a second ferromagnetic material (e.g., nickel) or paramagnetic material (e.g., platinum)). For example, in one embodiment, an interfacial layer of ferromagnetic material may include a thickness that is, for example, 15-30%, 20-40%, or 25-50% greater than the thickness of the internal layers of the multi-layer magnetic structure. Indeed, where the multi-layer magnetic structure includes layers of cobalt and layers of platinum, in one embodiment, interfacial layers of cobalt include a thickness (for example, a thickness which is greater than approximately 2 Å and less than approximately 8 Å), which is greater than the thickness of the internal layers, which may be alternating layers of platinum and cobalt. In one exemplary embodiment, the internal layers of platinum and cobalt include a thickness greater than approximately 2 Å and less than approximately 6 Å and preferably greater than approximately 2.5 and less than approximately 4.5 Å and more preferably approximately 3 Å.

Where, however, the multi-layer magnetic structure includes layers of nickel and layers of cobalt, interfacial layers of nickel may include a thickness (for example, greater than approximately 24 Å and less than approximately 8 Å), which is greater than a thickness of any or all of the internal layers combined. In one exemplary embodiment, the internal layers of cobalt and nickel include a thickness greater than 2 Å and less than 6 Å and preferably greater than 2.5 and less than 4.5 Å and more preferably 3 Å. Notably, in one embodiment, only one of the interfacial layers of one or both multi-layer magnetic regions (e.g., 22, 32) of the fixed, unpinned SAF region includes a thickness which is greater than the thicknesses of one or more (or all) of the associated internal layers of the multi-layer magnetic structure of the fixed, unpinned SAF region.

In some embodiments, e.g., as described in greater detail below and shown in FIG. 3, electrode 10 of the magnetoresistive stack/structure 100 may include a seed region 12. It should be noted that, although a seed region 12 is not illustrated in FIGS. 1 and 2, in some embodiments, electrode 10 of FIGS. 1 and 2 may also include a seed region 12 at its interface with the overlying region or layer. In some embodiments, the top surface of electrode 10 itself may act as the seed region or layer. After deposition/formation of seed region 12, the overlying region (e.g., "fixed" magnetic region 20) may be formed (e.g., deposited) on the seed region 12 of electrode 10. The seed region 12 may assist in the formation of the "fixed" magnetic region 20. The "fixed" magnetic region 20, as discussed above, may include a multi-layer, fixed unpinned SAF including, for example, a ferromagnetic region 22 (Anti Parallel layer 1 or AP1) and a ferromagnetic region 32 (e.g., Anti-Parallel layer 2, or AP2) (e.g., both including (i) cobalt and platinum (or palladium) or (ii) cobalt and nickel) separated by an AF coupling region 30 (e.g., including a non-ferromagnetic material such as ruthenium having a thickness of, for e.g., 4 Angstrom (+/−1 Angstrom)).

As alluded to above, some aspects of the present disclosure may include a seed region 12 disposed between electrode 10 and "fixed" region 20. In practice, the seed region 12 may facilitate the formation of the "fixed" region 20 on the electrode 10. In embodiments where electrode 10 provides the desired growth characteristics for the subsequent layers, the seed region 12 may be omitted. Though seed region 12 is depicted in FIG. 3 as a single layer, those of ordinary skill in the art will understand that seed region 12 also may include a multi-layer structure. The seed region 12 may include one or more of nickel, chromium, cobalt, iron, ruthenium, platinum, tantalum, and alloys thereof (for example, an alloy including nickel and/or chromium) or multilayers thereof having a thickness which is greater than or equal to approximately 20 Å, or greater than or equal to approximately 40 Å, or greater than or equal to approximately 50 Å, or preferably greater than or equal to approximately 60 Å, or more preferably greater than or equal to approximately 40 or approximately 50 Å and less than or equal to approximately 100 Å (for example, approximately 40 Å to approximately 60 Å), or even more preferably greater than or equal to approximately 60 Å and less than or equal to approximately 100 Å, or most preferably approximately 60 Å+/−10%. As depicted in FIG. 3, the seed region 12 may be disposed between and in physical contact with an electrically conductive metal material of an electrode/via/line (e.g., electrode 10 shown in FIG. 3) and "fixed" magnetic region 20.

In addition, "fixed" magnetic region 20 may include a transition region 34 and/or a reference region 36 disposed between region 32 and intermediate region 50, which as noted above may include a layer of dielectric material (forming a tunnel barrier) in the MTJ structure. The transition region 34 and/or reference region 36 may include one or more layers of material that, among other things, facilitate/improve growth of the intermediate region 50 during fabrication. In one embodiment, reference region 36 includes one or more or all of cobalt, iron and boron (for example, in an alloy—such as an amorphous alloy (e.g., CoFeB or CoFeBTa or CoFeTa)), and the transition region 34 may include a non-ferromagnetic transition metal such as tantalum, titanium, tungsten, ruthenium, niobium, zirconium, and/or molybdenum.

In some embodiments, reference region 36 also may include a multi-layer structure. For example, reference region 36 may include a layer of iron (for example, deposited as pure or substantially pure iron) and a layer of cobalt, iron and boron (for example, deposited as an alloy), wherein, after further/final processing (e.g., after annealing), the layer of iron at the interface may form a continuous atomic layer or may mix with the underlying ferromagnetic alloy in the final annealed structure, resulting in a high-iron interface region within reference region 36 adjacent to the intermediate layer 50. Notably, the reference and transition regions 34, 36 may be implemented/employed in any of the embodiments described herein.

In some embodiments, transition region 34 may be formed by depositing (or by another process) one or more non-ferromagnetic layers that alloy with one or more of the neighboring ferromagnetic regions (e.g., region 32), for example, during or in conjunction with a subsequent annealing process to thereby form transition region 34. In some embodiments, an alloy material may be directly deposited as the transition region 34 and or reference region 36. In general, transition region 34 and the reference region 36 may have any thickness. In some embodiments, a thickness (t) of the transition region 34 may be between approximately 1-8 Å, preferably approximately 1.5-5 Å, and more preferably approximately 2.5-3.5 Å. In some embodiments, a thickness (t) of the reference region 36 may be between approximately 6-13 Å, preferably approximately 8-12 Å, and more preferably approximately 9-9.5 Å. In some embodiments where an alloy material is directly deposited as the transition region 34, the thickness of the region may be approximately 8 Å. In some embodiments, transition region 34 and/or reference region 36 may have sub-atomic thicknesses. It should be noted that the exemplary thickness values discussed above are expected values of layer thicknesses immediately after deposition.

As a person skilled in the art would recognize, in some cases, after deposition (over time, after exposure to high temperatures, etc.), the material of the deposited region (e.g., any of the regions or layers described herein) will migrate into (diffuse, etc.) adjoining region (e.g., underlying region, etc.) to form an alloy. In such embodiments, e.g., although the transition and reference regions 34, 36 may appear as distinct layers immediately after formation of these regions, after subsequent processing operations (e.g., annealing), these regions may mix or alloy together to form a single alloyed region with (or separate from) the "fixed" region 20. Thus, in some cases, it may be difficult to distinguish regions 34 and 36 as being separate from the "fixed" region 20 in a finished magnetoresistive stack/structure 100 of the present disclosure. Instead, a region at the interface of the "fixed" region 20 with its overlying region (e.g., region 50 in FIG. 3) may have a greater concentration of the material(s) that forms the transition region 34 and the reference region 36.

In some embodiments, regions 22 and 32 (i.e., AP1 and AP2) may have strong perpendicular magnetic anisotropy (PMA) and may be strongly antiferromagnetically coupled to each other by coupling region 30. In some embodiments, strong perpendicular magnetic anisotropy of regions 22 and 32 may require one or both of these regions to have a strong crystalline orientation. In some embodiments of the current disclosure, the degree of crystallinity of region 32 (i.e., AP2) (and/or region 22, i.e., AP1) may be reduced without significant reduction of PMA and/or exchange coupling strength through AF coupling layer (region 30). Thus, in some embodiments, although both regions 22 and 32 have a crystalline microstructure, region 32 (AP2) may have a lower degree of crystallinity than region 22 (AP1). As known to a person of ordinary skill in the art, the degree of crystallinity indicates the degree of structural order in the solid region, and may be detected or measured by techniques, such as, for example, X-ray diffraction (XRD), nuclear magnetic resonance (NMR), etc. The reduction of crystallinity of region 32 may lead to reduced crystallinity of the overlying region 50 (i.e., the tunnel barrier layer in an MTJ structure) and therefore result in a smoothened or relatively smoother region 50 (i.e., a smoothed tunneling barrier). In some embodiments, a smoothened region 50 may lead to improved time dependent dielectric breakdown (TDDB) characteristics, and thus result in a better lifetime and/or endurance of a magnetoresistive device fabricated from the magnetoresistive stack 100. In some embodiments, a smoothened region 50 or sharp interface between the region 32 and the overlying region 50 due to reduced crystallinity of region 32 can potentially improve spin transfer torque switching efficiency, thus a low power MRAM device.

In some embodiments of the current disclosure, the coupling region 30 (e.g., the surface of the coupling region 30 that forms an interface with region 32 (i.e., AP2)) may be modified to reduce the crystallinity of region 32 (i.e., AP2), thereby resulting in a smoothened region 50. For example, in some embodiments, the surface of the coupling region 30 may be treated prior to deposition of region 32 thereon. In some embodiments, this surface treatment may include exposing the surface of region 30 to a selected gaseous atmosphere at a selected temperature and pressure. In some embodiments, the surface treatment may include exposing the surface of region 30 to an oxygen (nitrogen, or a mixture of other gases) atmosphere at room temperature at a pressure less than or equal to about 1 millitorr. In general, the coupling region 30 may be exposed to the gas for any amount of time. In some embodiments, the coupling region 30 may be exposed to the gas for less than about 10 seconds (e.g., 1-10 seconds). In some embodiments, the coupling region 30 may be exposed to the gas for less than about 60 seconds (e.g., 1-60 seconds). In some embodiments, region 30 may be treated by exposing the surface of region 30 to an atmosphere of other gases (e.g., a mixture of other gases) at room temperature or another temperature. In some embodiments, the surface treatment of coupling region 30 may be performed without causing a vacuum break in the manufacturing process.

In some embodiments, after forming (e.g., depositing) coupling region 30, the surface of region 30 may be treated by exposing the surface to a gas (e.g., substantially pure oxygen, a mixture of about 2-80% oxygen in nitrogen, or a mixture of other gases, etc.) at a pressure of less than or equal to about 1 millitorr (e.g., about 0.03-0.05 millitorr or less) for about ten seconds at a temperature less than about 35° C. in an enclosed chamber (e.g., oxidation chamber, deposition chamber, etc.). In some embodiments, surface treatment of coupling region 30 may be performed in the same vacuum chamber (referred to herein as deposition chamber) used to form (e.g., sputter deposit) the coupling region 30. FIG. 11 illustrates an exemplary deposition chamber used to treat the surface of coupling region 30. A vacuum pump may be fluidly coupled to the deposition chamber to create to a substantial vacuum in the chamber prior to treating the surface of coupling region 30. The vacuum pump may include (or be operatively coupled to) a cryo-pump or turbo-pump with a cold-trap (or water pump) to remove water vapor (and other contaminants) from the atmosphere in the chamber. As known to those having ordinary skill in the art, in vacuum applications, cold-traps are added to vacuum pumping systems to remove unwanted contaminants (e.g. water, solvents, acidic, or alkaline compounds) from the gas stream in a deposition chamber. A cold-trap removes water vapor (and other contaminants) from the gas stream by sublimating water vapor directly from the gas phase to the solid phase thus bypassing the liquid phase. The water vapor crystallizes out on a cold surface of the cold-trap (often appearing as frost on the trap) and reduces the moisture content in the atmosphere of the deposition chamber. In some embodiments, the cold plate may be kept at a temperature between about 70-100 Kelvin (or about 77-80 Kelvin) at least some time during pump down of the deposition chamber. After a desired level of low base pressure is obtained in the deposition chamber using cryo-pump or the vacuum pump with the cold-trap, the gas for surface treatment (e.g., substantially pure oxygen, a mixture of about 2-80% oxygen in nitrogen, or a mixture of other gases, etc.) is admitted into the chamber, and the surface of coupling region 30 is exposed to the gas for about ten seconds or less at a temperature less than about 35° C. In some embodiments, the surface of coupling region 30 is exposed to the gas for about sixty seconds or less at a temperature less than about 35° C. In some embodiments, the base pressure in the chamber prior to surface treatment may be less than or equal to (≤) about 1.5 E-7 torr (or ≤ about 5 E-7 torr). In some embodiments, during application of the surface treatment (e.g., with the gas in the chamber), the pressure in the chamber will be less than or equal to about 1 millitorr (e.g., about 0.03-0.05 millitorr or less). After the surface treatment, the overlying region (e.g., region 32) may be formed on or above the coupling region 30 in the same or a different chamber.

In some embodiments, substantially all of the multiple regions of magnetoresistive stack 100 may be formed in the same chamber without creating a vacuum break in the chamber. That is, a substrate may be placed in a deposition chamber (e.g., the deposition chamber of FIG. 11), the chamber pumped down to a desired pressure, and the multiple regions may be sequentially formed (e.g., sputter deposited, oxidized, etc.) by directing different process gases into the chamber, applying different process conditions to generate plasma, etc. The substrate may then be removed from the deposition chamber after substantially all of the regions of the stack 100 are formed. In such embodiments, the deposition chamber may not be pumped down (e.g., to a low base pressure using a cryo-pump or a vacuum pump with a cold-plate) between the deposition or formation of the different regions. Instead, the deposition chamber may be initially pumped down to the desired low base pressure using a cryo-pump or a vacuum pump with a cold-plate (to remove moisture and water vapor from the deposition chamber), and the multiple regions of the magnetoresistive stack 100 may be formed without creating a vacuum break in the chamber(s). For example, in some embodiments, the deposition chamber may be pumped down to a desired low base pressure immediately prior to the deposition or formation of some of the different regions. For example, in some embodiments, some of the regions (e.g., regions 10, 22 of FIG. 3) of the stack 100 may be formed in one deposition chamber and some other regions (region 30, etc.) may be formed in another deposition chamber. In such embodiments, the substrate may be moved from one deposition chamber to another during the fabrication process. In such embodiments, the deposition chamber may be pumped down to a desired low base pressure (e.g., using a cryo-pump or a vacuum pump with a cold-plate) immediately prior to the beginning of the deposition (or formation) process of region 30.

In some embodiments, after the deposition of region 30, the surface treatment of the region 30 may be carried out in a different chamber (for example, an oxidation chamber) with cryo-pump or the vacuum pump with a cold-trap from a multi-chamber MTJ fabrication system without causing a vacuum break in the MTJ fabrication process. A surface treatment may be performed in an oxidation chamber or a deposition chamber. After a desired level of low base pressure is obtained in the oxidation chamber using a cryo-pump or the vacuum pump with the cold-trap, the gas for surface treatment (e.g., substantially pure oxygen, a mixture of about 2-80% oxygen in nitrogen, or a mixture of other gases, etc.) may be admitted into the chamber, and the surface of coupling region 30 exposed to the gas for about ten seconds or less at a temperature less than about 35° C. In some embodiments, the surface of coupling region 30 is exposed to the gas for about sixty seconds or less at a temperature less than about 35° C. In some embodiments, during application of the surface treatment (e.g., with the gas in the chamber), the pressure in the chamber will be less than or equal to about 1 millitorr (e.g., about 0.03-0.05 millitorr or less).

In some embodiments, surface treatment of region 30 may induce high frequency roughness of the surface and may result in smaller grains and a smoother surface layer of region 30. When region 32 (i.e., AP2) is substantially formed (e.g., deposited) on region 30, the smoother surface layer of region 30 may result in a reduction in crystallinity of region 32. The crystallinity of region 32 may decrease by any amount (in some embodiments, the reduction may not result in an amorphous structure). The reduction in crystallinity of region 32 may result in a smoothened region 50 and improved TDDB characteristics when region 50 is provided or formed on or above region 32. This may also result in a sharp interface between regions 50 and 36 and thus an improved spin transfer torque switching efficiency.

In some embodiments, surface treatment of region 30 by exposing the surface of region 30 to a gaseous ambient may change the chemistry of the surface. For example, in embodiments, where region 30 includes ruthenium and the surface treatment includes exposing the surface of region 30 to oxygen (or, nitrogen, or another gas), the ruthenium at the surface may oxidize (or nitridize, etc.) and form an oxide interfacial layer 33 (see FIG. 3) of reacted material. In some embodiments, this interfacial layer 33 may be less than about 1 Å thick. In some embodiments, when region 32 (e.g., made of an alloy of cobalt and platinum (or palladium) is deposited on region 30 (having, for example, an oxide interfacial layer 33)), one or more constituents of the alloy (e.g., cobalt, platinum, palladium, etc.) may also react with the oxide interfacial layer 33 and form another oxide. It should be noted that, although a discrete interfacial layer 33 is illustrated in FIG. 3, this is only for the sake of description. In reality, such a layer may not be visible (e.g., in a cross-section), or even present, in some embodiments. However, in some cases, compositional analysis (e.g., by energy-dispersive X-ray spectroscopy, etc.) may reveal the presence of an oxide (or another reaction product as a result of exposure to the gas during surface treatment of region 30).

In place of, or in addition to, surface treatment of region 30 by exposing region 30 to a gas, in some embodiments, region 30 may be surface treated by providing a dusting of a material, such as, for example, platinum, palladium, iridium, iron, tungsten, molybdenum, rhodium, rhenium, chromium, osmium, etc., on the surface of region 30 before forming (e.g., depositing) region 32 (i.e., AP2) thereon. This dusting of material may also result in smaller grains and a smoother surface layer of region 30 and result in a reduction in crystallinity of region 32 and a smoothened region 50. In general, any material that does not significantly affect the antiferromagnetic coupling strength between regions 22 and 32 may be used for the dusting. In embodiments, where region 30 is surface treated by providing a dusting of material on the surface, the interfacial layer 33 may comprise this material. In some embodiments, the dusting may form an interfacial layer 33 less than about 1 Å thick. For example, in embodiments where the surface treatment of region 30 includes providing a dusting of platinum on the surface of region 30, the interfacial layer 33 may comprise platinum. In embodiments where the surface treatment includes both providing a dusting of a material and exposing the surface to a gas (e.g., oxygen) ambient, the interfacial layer 33 may include a reaction product of the gas, the dusting material, and/or one or more constituents of the overlying and underlying regions (i.e., regions 30 and 32).

It should be emphasized that, although FIG. 3 illustrates a discrete continuous interfacial layer 33, this is only exemplary and provided for the sake of description. As explained previously, in some embodiments, such a layer may not be detectable (e.g., in a cross-section) or even present. In embodiments, where the interfacial layer 33 is formed as a result of a dusting of material over the surface of region 30, the interfacial layer 33 may be a discontinuous layer of material (i.e., patches of material) on the surface of region 30. That is, as opposed to a continuous monolithic layer of material (which could break the coupling between regions 22 and 32), interfacial layer 33 may be a discontinuous layer with patches of material deposited on (or otherwise formed on) the surface of region 30. For example, in a plan view, interfacial layer 33 may appear as a patch work, or irregular puddles, of material atop region 30 with areas of region 30 exposed through gaps between the patches of the interfacial layer 33. Surface treating the coupling region 30 (by (a) exposing to a gas such as, for example, oxygen, nitrogen, etc., and/or (b) providing a dusting of a material such as, for example, platinum, palladium, iridium, or other material, on the surface of region 30) results in a reduction in the crystallinity of the overlying region 32 (i.e., AP2) without a significant reduction in the PMA and exchange coupling between regions 22 and 32.

With renewed reference to FIG. 1, a "free" region 60 (or storage region or layer) is arranged atop "fixed" region 20 with an intermediate region 50 positioned in between "fixed" region 20 and "free" region 60. In some embodiments, the intermediate region 50 may include dielectric material and may function as a tunnel barrier. Intermediate region 50 may be formed on or above a surface of the "fixed" region 20, and the "free" region 60 may be formed on or above a surface of the intermediate region 50. In some embodiments, intermediate region 50 may include an oxide material, such as, for example, MgO or AlO$_x$ (e.g., Al$_2$O$_3$), and may be formed by multiple steps of material deposition and oxidation. In general, intermediate region 50 may have any thickness. In some embodiments, the intermediate region 50 may have a thickness between 8.5-14.1 Å, preferably between 9.6-13.0 Å, and more preferably between 9.8-12.5 Å.

Although not illustrated in FIG. 1, in some embodiments, the "free" region 60 may also include one or more ferromagnetic layers (similar to "fixed" region 20). For example, in some embodiments, "free" region 60 may comprise at last two ferromagnetic regions separated by a coupling region (e.g., including tantalum, tungsten, molybdenum, ruthenium, rhodium, rhenium, iridium, chromium, osmium, and their combinations). The coupling region may provide either ferromagnetic coupling or antiferromagnetic coupling between the ferromagnetic regions. The coupling region of the "free" region 60, in some embodiments also may include a surface treatment as described in connection with region 30. Notwithstanding the specific construction of "free" region 60, "free" region 60 may include a magnetic vector (or moment) that can be moved or switched by applied magnetic fields or spin torque currents. The "free" region 60 may be formed from any ferromagnetic material having two or more stable magnetic states. These materials may include alloys of one or more of the ferromagnetic elements nickel, iron, cobalt, and boron. Additional elements may be added to the alloys to provide improved magnetic, electrical, or microstructural properties. In some embodiments, similar to "fixed" region 20, "free" region 60 also may include one or more SAF or SyF structures. In general, "free" region 60 may have any thickness, such as, for example, between 7-40 Å, preferably between 20-30 Å, and more preferably between 25-28.5 Å.

With continuing reference to FIG. 1, a capping region 86 (or dielectric layer) may be provided above the "free" region 60. Capping region 86 may include any suitable material and thickness. In some embodiments, capping region 86 may be formed from a dielectric material, including, but not limited to, magnesium oxide (MgO) or aluminum oxide (AlO$_x$) ((e.g., Al$_2$O$_3$)). In some embodiments, the thickness of the capping region 86 may be between approximately 3-14 Å, or preferably between approximately 5-12 Å, or more preferably between approximately 6-10 Å. Although not illustrated in FIG. 1, in some embodiments, an insertion element (e.g., including a non-ferromagnetic transition metal such as iridium, chromium, etc.) may be provided between the "free" region 60 and the capping region 86. In embodiments where the "free" region 60 includes multiple ferromagnetic regions coupled together by a coupling region (similar in structure to "fixed" region 20), the insertion element may be provided on the outermost ferromagnetic region of the "free" region. Similar to the interfacial layer 33, this insertion element may include a dusting of material over the surface of the "free" region 60. The insertion element may improve the bonding between the "free" region 60 and the capping region 86 and increase the PMA of the magnetoresistive stack 100

In some embodiments, magnetoresistive stack/structure 100 may include one or more additional layers, such as, e.g., a spacer layer between electrode 90 and the capping region 86. The spacer layer may be formed of a non-ferromagnetic material, such as, e.g., ruthenium or tantalum or an alloy of ruthenium or tantalum. In some embodiments, the spacer layer may include cobalt, iron, boron, or an alloy thereof (e.g., CoFeB).

It should be noted that the magnetoresistive stack 100 of FIG. 1 is only exemplary. As those with ordinary skill in the art will recognize, magnetoresistive stack 100 may have many other configurations. For example, in some embodiments, magnetoresistive stack 100 may have a dual spin filter structure in which a second "fixed" region is provided above "free" region 60 with a second dielectric region (that forms a second tunneling barrier) positioned between the "free" region 60 and this second dielectric region. In some embodiments, the second "fixed" region may also have a structure similar to that of "fixed" region 20. Specifically, the second "fixed" region may also include two ferromagnetic regions with a coupling region positioned in between (i.e., sandwiched), and an interface of the coupling region with one or both of the ferromagnetic regions (i.e., the top of bottom surface of the coupling region) may be surface treated (e.g., by (a) exposing the coupling region to a gas such as, for example, oxygen, nitrogen, etc., and/or (b) providing a dusting of a material such as, for example, platinum, palladium, iridium or other material, on the surface of the coupling region). U.S. Pat. Nos. 8,686,484; 9,136,464; and 9,419,208, each assigned to the assignee of the current application and incorporated by reference in its entirety herein, disclose several exemplary configurations of magnetoresistive stacks and methods of making such magnetoresistive stacks.

As previously explained, although the individual layers of FIGS. 1-3 are illustrated as distinct layers with sharp well defined boundaries, typically, the materials of two adjacent layers at an interface (between the layers) may diffuse into each other, and present an interfacial region of an alloy or a combination of the materials of the two individual layers. Further, while all of the layers or regions of these figures may be present and distinguishable immediately after formation of these regions, in some embodiments, it may be difficult to distinguish some of these regions (e.g., interfacial layer 33, etc.) in a cross-section of the stack. In some embodiments, some of these layers may appear as an interfacial region having a higher concentration of an element or a material.

As explained above, exemplary embodiments of the magnetoresistive stack 100 of the current disclosure include a "fixed" region (such as, "fixed" region 20 of FIG. 3) having multiple ferromagnetic regions (e.g., ferromagnetic regions 22 and 32 of FIG. 3) (e.g., comprising of cobalt and platinum (or palladium)) coupled together by an antiferromagnetic (AF) coupling region (e.g., coupling region 30) (for example, made of a non-ferromagnetic material such ruthenium, iridium, rhodium, rhenium, etc.) positioned in between the ferromagnetic regions. And, one or more surfaces of the coupling region 30 at an interface with a ferromagnetic region (e.g., region 32) may be surface treated (e.g., by (a) exposing the coupling region to a gas such as, for example, oxygen, nitrogen, etc., and/or (b) providing a dusting of a material such as, for example, platinum, palladium, iridium, or other material, on the surface of the coupling region). The surface treatment may result in a reduction in the crystallinity of the ferromagnetic region, which may result in a relatively smooth intermediate layer 50, and better TDDB performance of the MTJ structure without a significant reduction in PMA and exchange coupling between the ferromagnetic regions of the "fixed" region 20. This surface treatment may result in a relatively sharp interface between regions 50 and 20, thus leading to an improved spin transfer torque switching efficiency for low power MRAM device.

In magnetoresistive stack 100 of FIG. 1, "fixed" region 20, intermediate layer 50, and "free" region 60 may together form an MTJ having an MR and an RA. To determine the effect of surface treatment of the coupling region on these parameters (MR, RA, etc.) and other relevant parameters of an MTJ, experimental evaluations were conducted on multiple exemplary MTJ samples (having a "fixed" region 20 with ferromagnetic regions 22 and 32 comprising cobalt and platinum and coupling region 30 comprising ruthenium). The coupling regions of some of these samples were surface treated (with different conditions of surface treatment) and some of the samples were not surface treated. Results from these evaluations indicate that the performance of the MTJs that were subject to surface treatment were at least as good as, and in some cases better than, MTJs which were not subject to surface treatment. For example, FIGS. 4A-4C compare the RA, MR, and delta RA (i.e., change in RA between high and low resistance states) of the samples with and without surface treatment. In these evaluations, after pumping down (e.g., creating a vacuum) in the oxidation chamber using a vacuum pump with a cold-trap, the coupling regions of the surface treated samples were exposed to different conditions of oxygen exposure (e.g., 0.25 sccm (standard cubic centimeters per minute) for 5 seconds, 0.5 sccm for 5 seconds, 1 sccm for 5 seconds, and 1 sccm for 10 seconds).

As evident from FIGS. 4A-4C, oxygen surface treatment results in an increase in RA and decrease in MR as the surface treatment dose increases. FIGS. 4A-4C indicates that, as a result of surface treatment, RA increased by about 2 $\Omega\mu m^2$. It is believed that this increase in RA is partially due to improved tunnel barrier performance stemming from the formation of an oxide layer as a result of the ruthenium surface treatment. During experimentation it was found that the use of a cold-trap (e.g., in the vacuum pump fluidly coupled to the oxidation chamber (or deposition chamber) in which surface treatment was performed) resulted in significant improvements in the observed results. For example, in experiments where a cold-trap was not used, the increase in RA was significantly more than in experiments where a cold-trap was used. This improvement in results is believed to be at least partly due to the reduction in water vapor in the oxidation chamber (or deposition chamber) during the surface treatment. Magnetoresistance change (delta RA) also increases with surface treatment, further indicating that the tunnel barrier is improved. Although these results indicate the results with exposure to oxygen, it is believed that similar benefits can be achieved with exposure to other gases or a mixture of other gases. As explained previously, a dusting layer (such as Ir, Pt, Pd, etc.) may also be used for surface treatment of the coupling region.

Figure 7A:
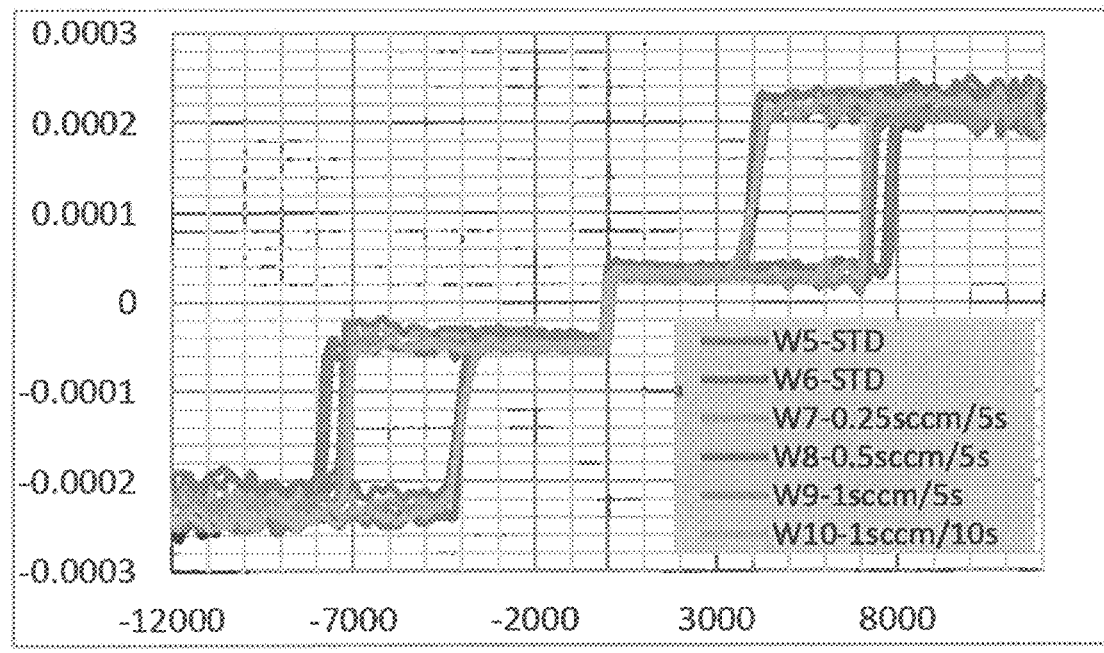
Figure 7B:
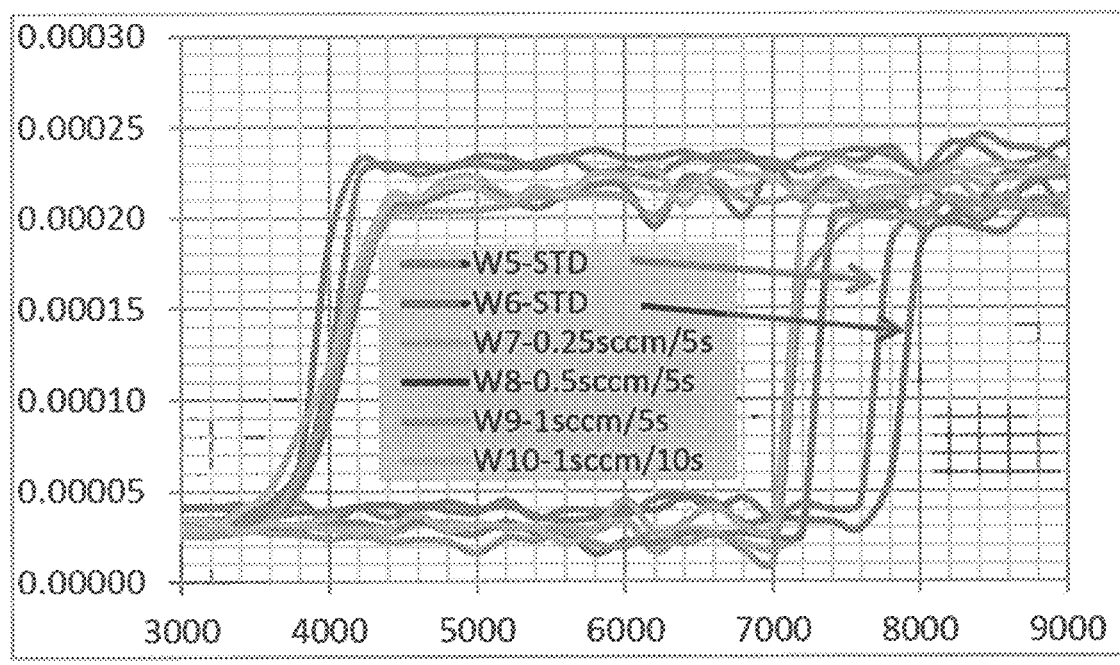

FIGS. 5A-6C compare the magnetic properties of a free region/layer of the MTJ samples with and without surface treatment. As can be seen in these figures, samples with a surface treated coupling layer showed at least similar magnetic properties (Hc, Hcpl, Hk, and magnetic moment) as, or slightly improved magnetic properties over, samples that were not surface treated. FIGS. 7A-7B show major M-H loops of these MTJ stacks with and without surface treatment. The results of FIGS. 7A-7B indicate that there is less than 1000 Oe reduction in AP1 switching and substantially no change in AP2 switching with layer surface treatment. This is likely the result of a slight reduction in antiferromagnetic coupling strength due to surface treatment. These results indicate that by surface treating the coupling region (by, e.g., exposing the coupling region surface to certain gases or providing a dusting of a material at the surface of the coupling region), the perpendicular MTJ with low RA can have an improved tunnel barrier properties/interface (e.g. increased RA and improved tunneling magnetoresistance (delta RA)) and potentially improved TDDB performance.

As alluded to above, the MTJ devices (formed using stacks 100) may include a sensor architecture or a memory architecture (among other architectures). For example, in an MTJ device having a memory configuration, the MTJs may be electrically connected to an access transistor and configured to couple or connect to various conductors, which may carry one or more control signals, as shown in FIG. 8. The MTJ devices may be used in any suitable application, including, e.g., in a memory configuration. In such instances, the MTJ devices may be formed as integrated circuits comprising a discrete memory device (e.g., as shown in FIG. 9A) or an embedded memory device having a logic therein (e.g., as shown in FIG. 9B), each including MRAM, which, in one embodiment is representative of one or more arrays of MRAM having a plurality of magnetoresistive stacks/structures, according to certain aspects of certain embodiments disclosed herein.

Exemplary methods of fabricating selected embodiments of the disclosed magnetoresistive stack 100 will now be described. It should be appreciated that the described methods are merely exemplary. In some embodiments, the methods may include a number of additional or alternative steps, and in some embodiments, one or more of the described steps may be omitted. Any described step may be omitted or modified, or other steps added, as long as the intended functionality of the fabricated magnetoresistive stack/structure remains substantially unaltered. Further, although a certain order is described or implied in the described methods, in general, the steps of the described methods need not be performed in the illustrated and described order. Further, the described methods may be incorporated into a more comprehensive procedure or process having additional functionality not described herein.

FIG. 10 depicts a flow chart of an exemplary method 300 of fabricating magnetoresistive stack/structure 100. In the discussion below, reference will be made to both FIGS. 1 and 3. A substrate (e.g., a substrate on which the magnetoresistive stack/structure 100 is to be formed) is placed in a deposition chamber. A first electrode (e.g., bottom electrode 10) may be first formed by any suitable process, including, e.g., deposition (step 310). In some embodiments, electrode 10 may be formed on a surface of the substrate that defines a plane. A "fixed" region 20 then may be formed on an exposed surface of electrode 10. Forming the "fixed" region 20 may include forming (e.g., by depositing) a first ferromagnetic region 22 on or above electrode 10 (step 320). A coupling region 30 may then be formed on or above region 22 (step 330). A surface (e.g., top surface) of the coupling region 30 may then be surface treated by, for example, exposing to oxygen (or other gas) at room temperature at less than or equal to about 1 milltorr pressure (step 340). As explained previously, a vacuum pump with a cold-trap or a cryo-pump is used to remove water vapor from the deposition chamber prior to the surface treatment. In some embodiments, the cryo-pump or the vacuum pump with cold trap is used to remove the water vapor from oxidation chamber prior to beginning the surface treatment (step 340). In some embodiments, the cryo-pump or the vacuum pump with the cold-trap is used to remove water vapor from the deposition chamber prior to beginning the fabrication process (e.g., step 310). Alternatively or additionally (to step 340), in some embodiments, the surface of the coupling region 30 may be surface treated by providing a dusting of material (e.g., iridium, platinum, palladium, etc.) on the surface. A second ferromagnetic region 32 may then be formed on or above the coupling region 30 (step 350). An intermediate region 50 then may be formed on or above region 32 (step 360), and a "free" region 60 may be formed on or above the intermediate region 50 (step 370). Then, a capping region 86 may be formed atop the "free" region 60 (step 380), and the second electrode 90 formed on or above the "free" region 60 (step 390).

In some embodiments, magnetoresistive stack 100 may be fabricated by depositing each succeeding region directly on a surface of the region below. For instance, with reference to FIG. 1, in some embodiments, region 20 may be formed directly on a surface (e.g., of electrode 10, and ferromagnetic region 22 may be formed directly on a top surface of electrode 10, and so forth. Any suitable method may be used to form the different regions or layers. Since suitable integrated circuit fabrication techniques (e.g., deposition, sputtering, evaporation, plating, etc.) that may be used to form the different layers are known to those of ordinary skill in the art, they are not described here in great detail. In some embodiments, forming some of the layers may involve thin-film deposition processes, including, but not limited to, physical vapor deposition techniques such as ion beam sputtering and magnetron sputtering. And, forming thin insulating layers, such as the tunnel barrier layers, may involve physical vapor deposition from an oxide target, such as by radio-frequency (RF) sputtering, or by deposition of a thin metallic film followed by an oxidation step, such as oxygen plasma oxidation, oxygen radical oxidation, or natural oxidation by exposure to a low-pressure oxygen environment.

In some embodiments, formation of some or all of the layers of magnetoresistive stack 100 may also involve known processing steps such as, for example, selective deposition, photolithography processing, etching, etc., in accordance with any of the various conventional techniques known in the semiconductor industry. In some embodiments, during deposition of the disclosed "fixed" and "free" regions, a magnetic field may be provided to set a preferred easy magnetic axis of the region (e.g., via induced anisotropy). Similarly, a strong magnetic field applied during the post-deposition high-temperature anneal step may be used to induce a preferred easy axis and a preferred pinning direction for any antiferromagnetically pinned materials.

In one aspect, a method of fabricating a magnetoresistive device is disclosed. The method may include forming an intermediate region, forming a magnetically free region on one side of the intermediate region, and forming a magnetically fixed region on an opposite side of the intermediate region. Forming the magnetically fixed region may include forming a first ferromagnetic region, forming an antiferromagnetic coupling region on one side of the first ferromagnetic region, treating a surface of the antiferromagnetic coupling region by exposing the surface to a gas, and forming a second ferromagnetic region on the treated surface of the antiferromagnetic coupling region.

Various embodiments of the disclosed method may alternatively or additionally include the following features: treating the surface of the antiferromagnetic coupling region may include exposing the surface to substantially pure oxygen; treating the surface of the antiferromagnetic coupling region may include exposing the surface to a mixture of about 2-80% oxygen in other gases; treating the surface of the antiferromagnetic coupling region may include exposing the surface to oxygen at a pressure less than or equal to 1 millitorr; treating the surface of the antiferromagnetic coupling region may include exposing the surface to the gas at a pressure less than or equal to 0.05 millitorr; treating the surface of the antiferromagnetic coupling region may include exposing the surface to the gas for a time period less than or equal to about 60 seconds; treating the surface of the antiferromagnetic coupling region may include exposing the surface to the gas for a time period less than or equal to about 10 seconds; treating the surface of the antiferromagnetic coupling region may include exposing the surface to oxygen for a time period less than or equal to about 10 seconds at a temperature less than about 35° C.; treating the surface of the antiferromagnetic coupling region may include exposing the surface to oxygen in a vacuum chamber, and the method may further include removing water vapor from the vacuum chamber prior to the step of treating the surface of the antiferromagnetic coupling region; treating the surface of the antiferromagnetic coupling region may include exposing the surface to oxygen in a vacuum chamber, and the method may further include reducing a base pressure within the vacuum chamber using a vacuum pump having a cold trap prior to the step of treating the surface of the antiferromagnetic coupling region; the steps of forming the first ferromagnetic region, forming the antiferromagnetic coupling region, treating the surface of the antiferromagnetic coupling region, and forming a second ferromagnetic region may be performed in a vacuum chamber without creating a vacuum break between the steps; and treating the surface of the antiferromagnetic coupling region may include providing a dusting of at least one of platinum, palladium, iridium, iron, tungsten, molybdenum, rhodium, rhenium, chromium, or osmium on the surface of the antiferromagnetic coupling region.

In another aspect, a method of fabricating a magnetoresistive device is disclosed. The disclosed method may include forming an intermediate region, forming a magnetically free region on one side of the intermediate region, and forming a magnetically fixed region on an opposite side of the intermediate region. Forming the magnetically fixed region may include forming a first ferromagnetic region, forming an antiferromagnetic coupling region on one side of the first ferromagnetic region, exposing a surface of the antiferromagnetic coupling region to oxygen at a pressure less than or equal to 1 millitorr, and forming a second ferromagnetic region on the exposed surface of the antiferromagnetic coupling region.

Various embodiments of the disclosed method may alternatively or additionally include the following features: exposing the surface of the antiferromagnetic coupling region may include exposing the surface to a mixture of about 2-80% oxygen in other gases; exposing the surface of the antiferromagnetic coupling region may include exposing the surface to oxygen at a pressure less than or equal to 0.05 millitorr; exposing the surface of the antiferromagnetic coupling region may include exposing the surface to oxygen for a time period less than or equal to about 10 seconds at a temperature less than about 35° C.; exposing the surface of the antiferromagnetic coupling region may include exposing the surface to oxygen in a vacuum chamber, and the method may further include removing water vapor from the vacuum chamber prior to the step of exposing the surface; exposing the surface of the antiferromagnetic coupling region may include exposing the surface to oxygen in a vacuum chamber, and the method may further include decreasing a base pressure within the vacuum chamber using a vacuum pump having a cold trap prior to the step of exposing the surface.

In yet another aspect, a magnetoresistive device is disclosed. The device may include a magnetically free region, an intermediate region formed on one side or the magnetically free region, and a magnetically fixed region formed on an opposite side of the intermediate region. The magnetically fixed region may include an unpinned synthetic antiferromagnetic (SAF) structure including at least a first ferromagnetic region and a second ferromagnetic region separated by an antiferromagnetic coupling region. Wherein (a) the first ferromagnetic region and a second ferromagnetic region may have a crystalline microstructure, and (b) the second ferromagnetic region may have a lower degree of crystallinity than the first ferromagnetic region.

Various embodiments of the disclosed magnetoresistive device may alternatively or additionally include the following features: the second ferromagnetic region may be positioned adjacent the intermediate region; the second ferromagnetic region may be positioned adjacent the intermediate region, and the magnetoresistive stack may further include an interfacial layer between the intermediate region and the second ferromagnetic region, wherein the interfacial layer includes an oxide material.

Although various embodiments of the present disclosure have been illustrated and described in detail, it will be readily apparent to those skilled in the art that various modifications may be made without departing from the present disclosure or from the scope of the appended claims.

What is claimed is:

1. A method of fabricating a magnetoresistive device, comprising:
   forming an intermediate region;
   forming a magnetically free region on one side of the intermediate region; and
   forming a magnetically fixed region on an opposite side of the intermediate region, wherein forming the magnetically fixed region includes:
     forming a first ferromagnetic region;
     forming an antiferromagnetic coupling region on one side of the first ferromagnetic region;
     upon forming the antiferromagnetic coupling region, treating a surface of the antiferromagnetic coupling region by:
       exposing the surface to a mixture of about 2-80% oxygen in other gases; and
       providing a dusting of palladium on the surface exposed to the mixture; and
     forming a second ferromagnetic region on the treated surface of the antiferromagnetic coupling region,
     wherein treating the surface of the antiferromagnetic coupling region includes exposing the surface to the mixture in a vacuum chamber at a pressure less than or equal to 0.05 millitorr, and wherein the method further comprises removing water vapor from the vacuum chamber prior to the step of treating the surface of the antiferromagnetic coupling region.

2. The method of claim 1, wherein the surface is exposed to the mixture of about 2-80% oxygen in other gases at a pressure between 0.03 millitorr and 0.05 millitorr.

3. The method of claim 1, wherein the surface is exposed to the mixture of about 2-80% oxygen in other gases for a time period less than or equal to about 60 seconds.

4. The method of claim 1, wherein the surface is exposed to the mixture of about 2-80% oxygen in other gases for a time period less than or equal to about 10 seconds.

5. The method of claim 1, wherein the surface is exposed to the mixture of about 2-80% oxygen in other gases for a time period less than or equal to about 10 seconds at a temperature less than about 35° C.

6. The method of claim 1, wherein the other gases include nitrogen.

7. The method of claim 1, wherein the method further comprises reducing a base pressure within the vacuum chamber using a vacuum pump having a cold trap prior to the step of treating the surface of the antiferromagnetic coupling region.

8. A method of fabricating a magnetoresistive device, comprising:
   forming an intermediate region;
   forming a magnetically free region on one side of the intermediate region; and forming a magnetically fixed region on an opposite side of the intermediate region, wherein forming the magnetically fixed region includes:
 forming a first ferromagnetic region;
 forming an antiferromagnetic coupling region on one side of the first ferromagnetic region;
 upon forming the antiferromagnetic coupling region, treating a surface of the antiferromagnetic coupling region by:
  exposing the surface of the antiferromagnetic coupling region to a mixture of about 2-80% oxygen in other gases, including nitrogen, at a pressure less than or equal to 1 millitorr for a time period less than or equal to about 10 seconds at a temperature less than about 35° C.; and
  providing a dusting of palladium on the surface exposed to the mixture, wherein the dusting of palladium on the surface forms an interfacial layer that is less than 1 Å thick; and
 forming a second ferromagnetic region on the exposed surface of the antiferromagnetic coupling region,
 wherein exposing the surface of the antiferromagnetic coupling region includes exposing the surface to the mixture in a vacuum chamber, and wherein the method further comprises removing water vapor from the vacuum chamber prior to the step of exposing the surface.

9. The method of claim 8, wherein the surface of the antiferromagnetic coupling region is exposed to the mixture of about 2-80% oxygen in other gases at a pressure less than or equal to 0.05 millitorr.

10. The method of claim 8, wherein the method further comprises decreasing a base pressure within the vacuum chamber using a vacuum pump having a cold trap prior to the step of exposing the surface.

11. The method of claim 1, wherein an interfacial layer is formed upon treating the surface of the antiferromagnetic coupling region, the interfacial layer including a reaction product of the mixture, the dusting, and one or more constituents of at least one of the first ferromagnetic region or the second ferromagnetic region.

12. The method of claim 1, wherein an interfacial layer is formed as a result of the dusting, the interfacial layer being a discontinuous layer of material on the antiferromagnetic coupling region.

13. The method of claim 8, wherein the interfacial layer is formed upon treating the surface of the antiferromagnetic coupling region, the interfacial layer including a reaction product of the mixture, the dusting, and one or more constituents of at least one of the first ferromagnetic region or the second ferromagnetic region.

14. A method of fabricating a magnetoresistive device, comprising:
 forming an intermediate region;
 forming a magnetically free region on one side of the intermediate region; and
 forming a magnetically fixed region on an opposite side of the intermediate region, wherein forming the magnetically fixed region includes:
  forming a first ferromagnetic region;
  forming an antiferromagnetic coupling region on one side of the first ferromagnetic region;
  upon forming the antiferromagnetic coupling region, treating a surface of the antiferromagnetic coupling region by:
   exposing the surface of the antiferromagnetic coupling region to a mixture of about 2-80% oxygen in other gases, including nitrogen, at a pressure less than or equal to 1 millitorr for a time period less than or equal to about 10 seconds at a temperature less than about 35° C.; and
   providing a dusting of palladium on the surface exposed to the mixture, wherein the dusting of palladium on the surface forms an interfacial layer that is less than 1 Å thick; and
  forming a second ferromagnetic region on the exposed surface of the antiferromagnetic coupling region,
  wherein exposing the surface of the antiferromagnetic coupling region includes exposing the surface to the mixture in a vacuum chamber.

15. The method of claim 14, wherein the method further comprises:
 removing water vapor from the vacuum chamber prior to the step of exposing the surface; and
 decreasing a base pressure within the vacuum chamber using a vacuum pump having a cold trap prior to the step of exposing the surface.

16. The method of claim 14, wherein the surface of the antiferromagnetic coupling region is exposed to the mixture of about 2-80% oxygen in other gases at a pressure less than or equal to 0.05 millitorr.

17. The method of claim 14, wherein the surface is exposed to the mixture of about 2-80% oxygen in other gases at a pressure between 0.03 millitorr and 0.05 millitorr.

18. The method of claim 14, further comprising:
 forming a seed region at an interface between the magnetically fixed region and an electrode.

19. The method of claim 18, wherein the seed region includes a multi-layer structure, and wherein the seed region includes one or more of nickel, chromium, cobalt, iron, ruthenium, platinum, tantalum, or alloys thereof.

20. The method of claim 14, wherein the method further comprises reducing a base pressure within the vacuum chamber using a vacuum pump having a cold trap prior to the step of treating the surface of the antiferromagnetic coupling region.

\* \* \* \* \*